(12) United States Patent
Hsu et al.

(10) Patent No.: US 7,617,476 B2
(45) Date of Patent: Nov. 10, 2009

(54) METHOD FOR PERFORMING PATTERN PITCH-SPLIT DECOMPOSITION UTILIZING ANCHORING FEATURES

(75) Inventors: Duan-Fu Stephen Hsu, Fremont, CA (US); Noel Corcoran, San Jose, CA (US); Jang Fung Chen, Cupertino, CA (US); Douglas Van Den Broeke, Sunnyvale, CA (US)

(73) Assignee: ASML Masktools B.V. (NL)

( * ) Notice: Subject to any disclaimer, the term of this patent is extended or adjusted under 35 U.S.C. 154(b) by 138 days.

(21) Appl. No.: 11/898,647

(22) Filed: Sep. 13, 2007

(65) Prior Publication Data
US 2008/0092106 A1 Apr. 17, 2008

Related U.S. Application Data

(60) Provisional application No. 60/844,073, filed on Sep. 13, 2006.

(51) Int. Cl.
*G06F 17/50* (2006.01)
(52) U.S. Cl. .......................................... 716/20; 716/21
(58) Field of Classification Search ............. 716/19–21; 430/5, 22, 30
See application file for complete search history.

(56) References Cited

U.S. PATENT DOCUMENTS 7,378,202 B2 * 5/2008 Granik et al. .................. 430/30
7,488,933 B2 * 2/2009 Ye et al. .................. 250/252.1

\* cited by examiner

*Primary Examiner*—Jack Chiang
*Assistant Examiner*—Binh C Tat
(74) *Attorney, Agent, or Firm*—Pillsbury Winthrop Shaw Pittman LLP

(57) ABSTRACT

A method for decomposing a target pattern containing features to be printed on a wafer into multiple patterns. The method includes the steps of: (a) determining a minimum critical dimension and pitch associated with a process to be utilized to image the multiple patterns; (b) generating an anchoring feature; (c) disposing the anchoring feature adjacent a first feature of the target pattern; (d) growing the anchoring feature a predetermined amount so as to define a first area; (e) assigning any feature within the first area to a first pattern; (f) disposing the anchoring feature adjacent a second feature of the target pattern; (g) growing the anchoring feature the predetermined amount so as to define a second area; and (h) assigning any feature within the second area to a second pattern. Steps (c)-(h) are then repeated until the densely spaced features within the target pattern have been assigned to either the first or second pattern.

20 Claims, 7 Drawing Sheets

METHOD FOR PERFORMING PATTERN PITCH-SPLIT DECOMPOSITION UTILIZING ANCHORING FEATURES

RELATED APPLICATIONS

This application claims priority to U.S. Patent Application Ser. No. 60/844,073, filed on Sep. 13, 2006, which is incorporated by reference herein in its entirety.

TECHNICAL FIELD

The technical field of the present invention relates generally to a method, program product and apparatus for performing a decomposition of a target pattern into multiple patterns so as to allow the target pattern to be imaged utilizing, for example, multiple masks in a multiple illumination process.

BACKGROUND OF THE INVENTION

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens;" however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit.

Of course, one of the goals in integrated circuit fabrication is to faithfully reproduce the original circuit design on the wafer (via the mask). As the critical dimensions of the target patterns become increasingly smaller, it is becoming increasingly harder to reproduce the target patterns on the wafer. However, there are known techniques that allow for a reduction in the minimum CD that can be imaged or reproduced in a wafer. One such technique is the double exposure technique wherein features in the target pattern are imaged in two separate exposures.

For example, one commonly known double exposure technique is referred to as double-patterning or DPT. This technique allows the features of a given target pattern to be separated into two different masks and then imaged separately to form the desired pattern. Such a technique is typically utilized when the target features are spaced so closely together that it is not possible to image the individual features. In such a situation, the target features are separated into two masks such that all the features on a given mask are spaced sufficiently apart from one another so that each feature may be individually imaged. Then, by imaging both masks in a sequential manner (with the appropriate shielding), it is possible to obtain the target pattern having the densely spaced features that could not be properly imaged utilizing a single mask.

Thus, by separating the target features into two separate masks, such that the pitch between each of the features on a given mask is above the resolution capabilities of the imaging system, it is possible to improve imaging performance. Indeed, the above-mentioned double exposure techniques allow for a $k_1 < 0.25$. However, problems and limitations still exist with currently known double exposure techniques.

For example, current decomposition algorithms are primarily rule-based algorithms, which require an excessive number of rules to handle today's increasingly complex designs. More specifically, with a set of pre-constructed geometric rules, it is possible to start performing pitch-split decomposition. This entails separating (also referred to as coloring) the odd and even pitch features into two separate geometry groups or patterns. Conceptually, this is straight forward process. However, in an actual IC circuit design, the local 2-dimensional geometry environment is very complex. As such, it is often difficult to identify "odd" and "even" pitch features from any of the localized dense pattern groups. As a result, the existing rule-based approach causes numerous coloring conflicts that need additional exceptional rules and/or operator intervention in order to resolve these conflicts. The need for such additional rules or operator invention make current rule-based systems very time consuming and problematic to utilize as often significant time must be taken to tailor the rule set to the given target design.

It is an object of the present invention to overcome such deficiencies in known rule-based pattern decomposition techniques.

SUMMARY OF THE INVENTION

In view of the foregoing, it is an object of the present invention to overcome the deficiencies of known prior art techniques by providing a simplified decomposition process that does not require the generation of an extensive rule-base set, and which is suitable for use with substantially any target pattern.

In summary, the present invention provides a method for decomposing a target pattern containing features to be printed on a wafer into multiple patterns. The method includes the steps of: (a) determining a minimum critical dimension and pitch associated with a process to be utilized to image the multiple patterns; (b) generating an anchoring feature; (c) disposing the anchoring feature adjacent a first feature of the target pattern; (d) growing the anchoring feature a predetermined amount so as to define a first area; (e) assigning any feature within the first area to a first pattern; (f) disposing the anchoring feature adjacent a second feature of the target pattern; (g) growing the anchoring feature the predetermined amount so as to define a second area; and (h) assigning any feature within the second area to a second pattern. Steps (c)-(h) are then repeated until the densely spaced features within the target pattern have been assigned to either the first or second pattern.

As explained below in further detail, the process of the present invention provides numerous advantages over the known decomposition processes. Most importantly, the process provides for a quick and efficient method of decomposing the target pattern, and eliminates the need for the generation of a complicated set of rules to govern pattern decomposition. In particular, the process of the present invention allows for an efficient method of decomposing any localized densely spaced pattern group.

Additional advantages of the present invention will become apparent to those skilled in the art from the following detailed description of exemplary embodiments of the present invention.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

The invention itself, together with further objects and advantages, can be better understood by reference to the following detailed description and the accompanying drawings.

DETAILED DESCRIPTION OF THE INVENTION

As explained in further detail below, the decomposition process of present invention defines a geometric space or area having a predetermined size, which is based on the minimum acceptable critical dimension (CD) and pitch for the given process, and then utilizes this predefined space to alternatively assign or color segments of the densely spaced features of the target pattern into separate patterns. By basing the size of the predefined space utilized to segment the target pattern alternately into first and second patterns on the minimum CD and pitch of the given process, it is possible to ensure that the features contained in the first and second patterns will be sufficiently spaced apart from one another such that the features in each pattern will be properly imaged. In other words, the spacing of the features in both the first pattern and second pattern will be above the minimum resolution requirements of the given process.

Figure 1:
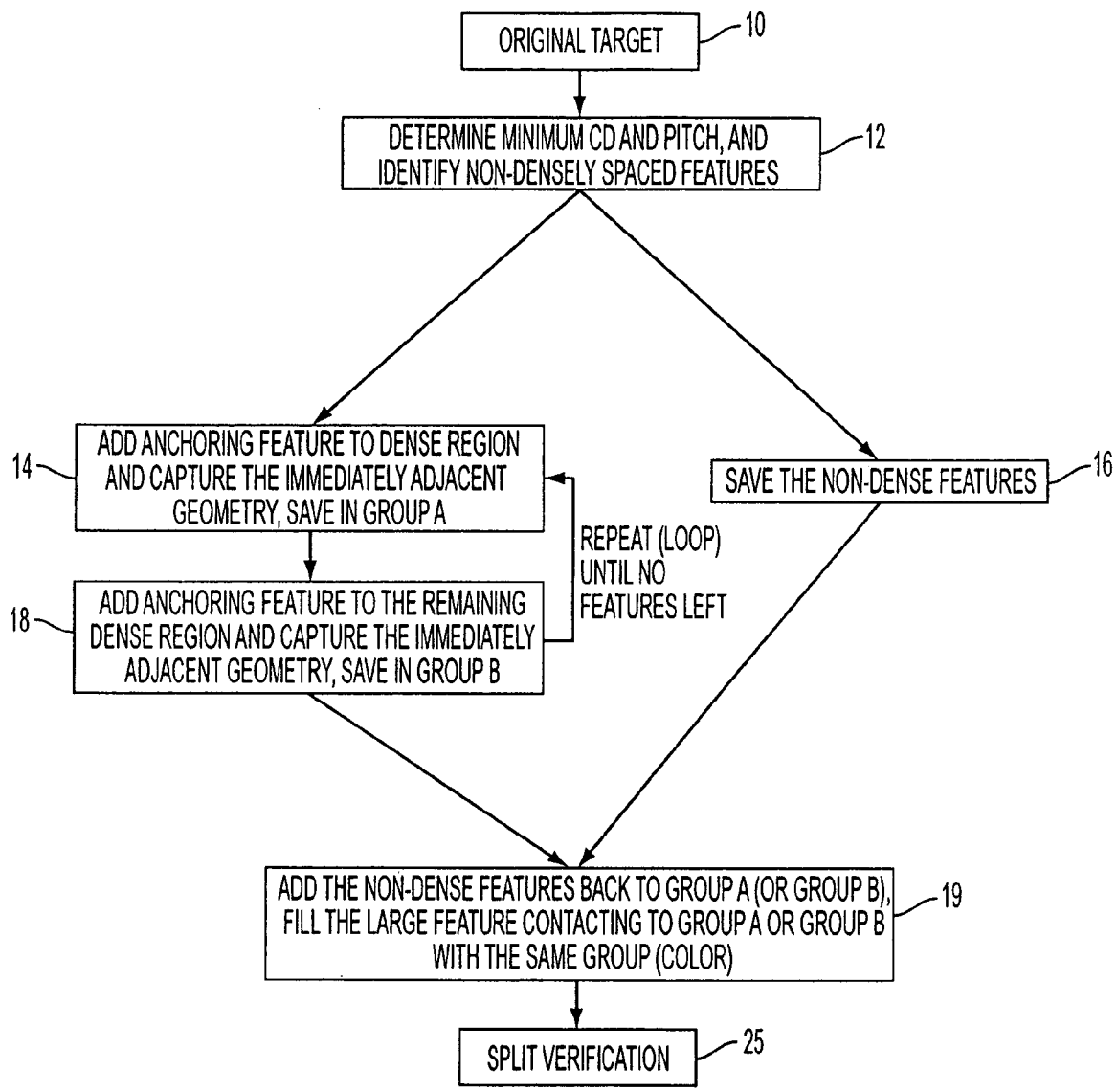
FIG. 1 is an exemplary flowchart illustrating the decomposition process of the present invention, which is utilized to decompose a target pattern into multiple patterns.
Figure 2:
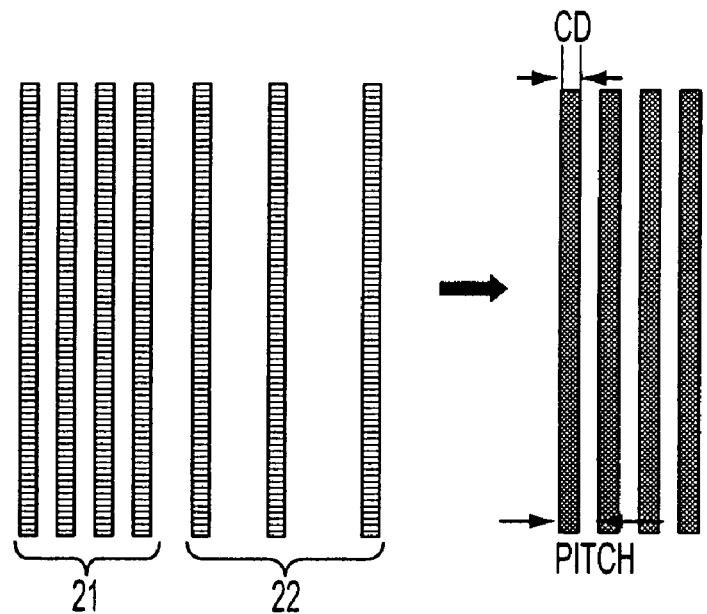
FIG. 2 illustrates an exemplary target pattern that will be decomposed into multiple segments utilizing the decomposition process of the present invention.

FIG. 1 is an exemplary flowchart illustrating a first embodiment of the present invention. Referring to FIG. 1, the first step (Step 10) in the process is to define the original target pattern to be decomposed into two or more patterns. In the given example, the target pattern is decomposed into two separate patterns. However, it is also possible to decompose a target into more than two patterns. In the next step (Step 12), the minimum acceptable CD and minimum acceptable pitch that can be imaged for the given process is determined. It is noted that the minimum acceptable CD and pitch is dependent on the illumination process and system to be utilized to image the target pattern and can be determined by empirical or simulation techniques. It is noted that in Step 12 it is also possible to identify the densely spaced and non-densely spaced features in the target design, and separate out the non-densely spaced features, as these features can be placed in either pattern resulting from the decomposition process. By separating out the non-dense features at this stage, the time required for the decomposition process to be completed can be reduced. It is further noted that the dense features are defined, for example, as those features having a pitch less than the minimal acceptable pitch of the given process (i.e., the features are too close to an adjacent feature to image properly). The non-dense features can be added back to either pattern after the decomposition process of the dense features is complete. FIG. 2 illustrates Step 12 of the process. In the example shown, based on the pitch between the features, four densely spaced features 21 and three non-densely spaced features 22 are identified. The non-dense features are separated out and stored so as to allow for the non-dense features to be rejoined in one of the decomposed patterns (Step 16) after processing of the dense features.

Figure 3:
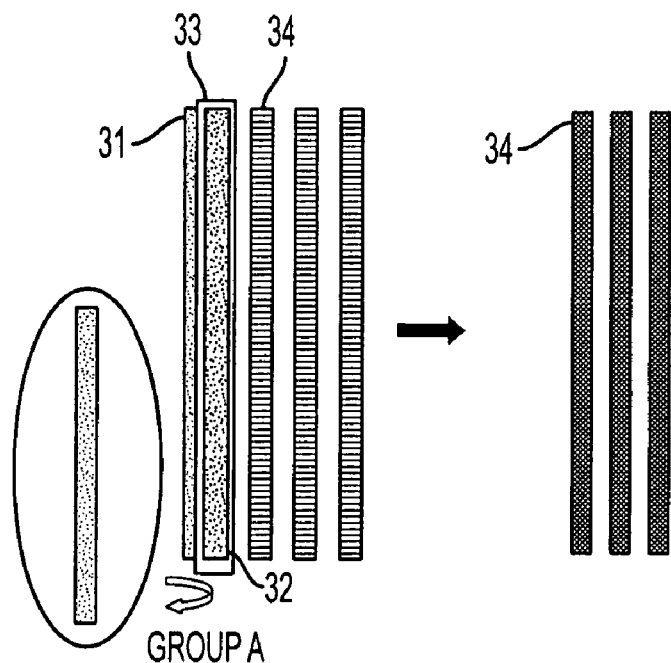
FIGS. 3-8 illustrate the decomposition process of the present invention being applied to the target pattern of FIG. 2.

Referring to FIG. 3, in the next step (Step 14), an anchoring feature 31 having an edge-to-edge width (or separation) equal to or less than half the critical dimension of the given process (CD/2) is placed adjacent the left-most or right-most feature of the densely-spaced features identified in Step 12. The side of the anchoring feature 31 adjacent the densely spaced feature is then grown or extended by an amount equal to the minimum acceptable pitch defined in Step 12. Then all features within this area 33 defined by enlarging the anchoring feature are determined and/or captured and assigned to a first pattern. In the given example, feature 32 would be assigned to pattern A (or Group A) as it falls within area 33. It is noted that while the example of FIG. 3 only illustrates line 32 being included in the extended area 33, other features or partial features could also be included in the area, and if so, would be removed and assigned to pattern A along with feature 32. One example would be if there was a vertical feature connecting feature 32 with feature 34. In such a case, the vertical feature would effectively be segmented and whatever portion of the vertical feature that was within area 33 would be removed with feature 32 and placed in pattern A. Referring again to FIG. 3, after completion of this step, feature 32 has been assigned to pattern A and removed from the original pattern of densely space features.

Figure 4:
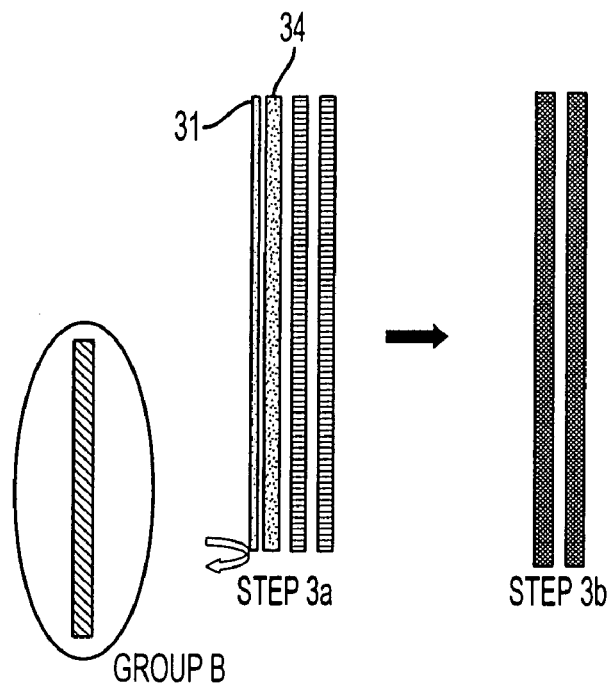
Figure 5:
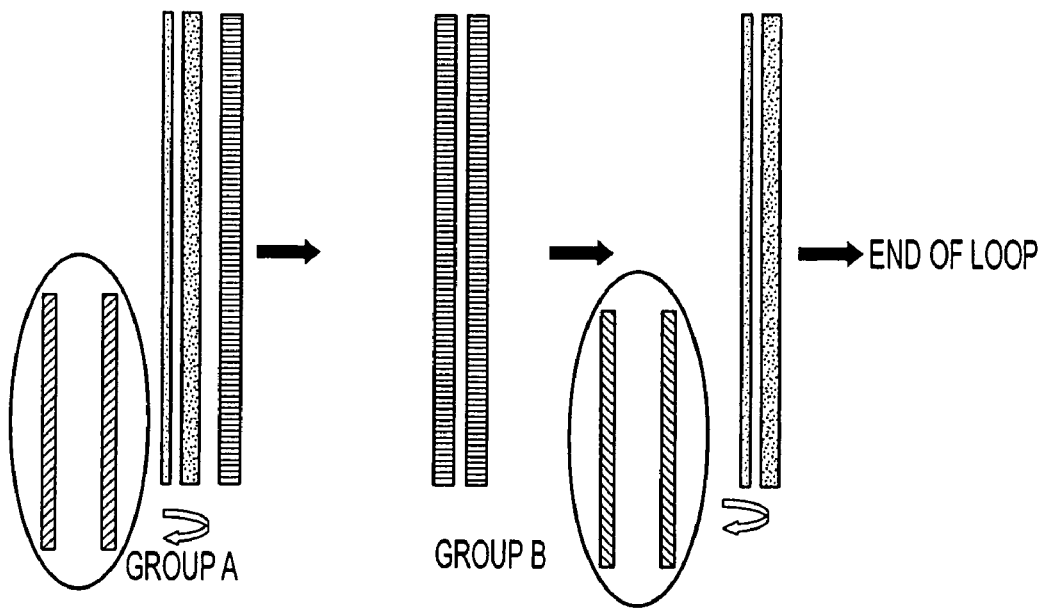

Next, as shown in FIG. 4, in Step 18 the anchoring feature 31 is added to the next left-most feature in the densely spaced pattern (which in this case is feature 34), and as above, the anchoring feature is then grown or extended by an amount equal to the minimum acceptable pitch. Then all features within this grown area defined by enlarging the anchoring feature are determined/captured and assigned to a second pattern. In the given example, feature 34 would be assigned to pattern B (or Group B). Steps 14 and 18 are then performed repeatedly (in a loop manner) until all of the densely spaced features of the original target pattern have been processed. FIG. 5 illustrates the process being applied to the two remaining dense features of the example pattern. It is noted that this process alternately assigns features to Group A and Group B, which is necessary for proper decomposition. Furthermore, the foregoing process may be initially started on either the left-most or right-most located feature in the design. However, once the left or right side of the design is selected, the process should continue to be applied in the same direction (i.e., moving to the right if the left-most feature is initially selected, and moving to the left if the right-most feature is initially selected) until all features have been processed.

Figure 6:
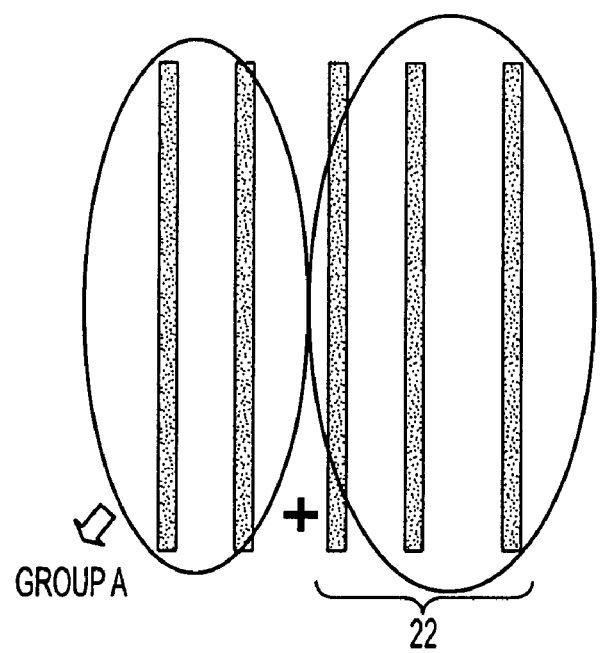

Once all of the densely spaced features have been processed and assigned to a pattern (or group), in the next step (Step 19) the non-dense features are added back to one of the patterns. In the example illustrated in FIG. 6, the non-dense patterns 22 are added back into pattern A (or Group A). As noted above, the non-dense patterns 22 can be added back to either of the decomposed patterns.

Figure 7:
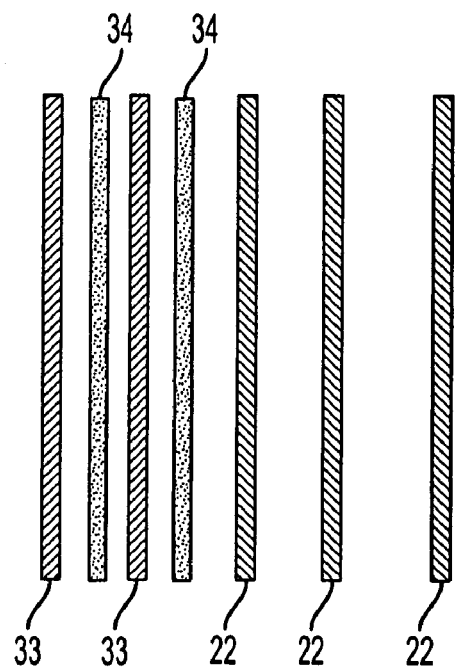
Figure 8:
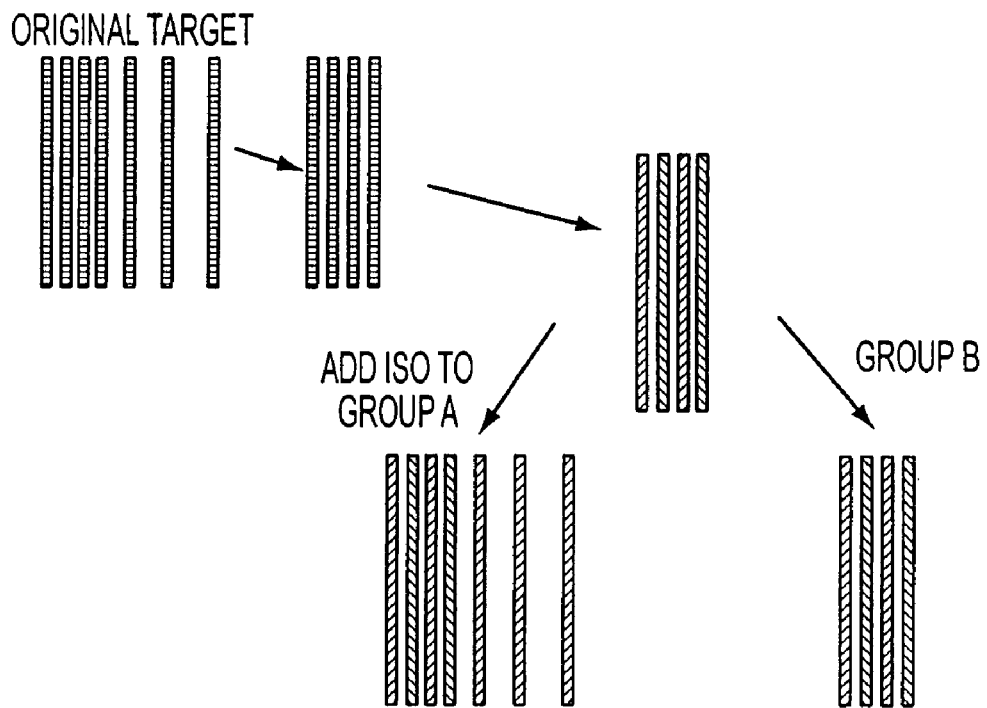

The final result of the foregoing process is illustrated in FIG. 7. As shown, densely spaced features 33 and the non-densely spaced features 22 are placed in pattern A and the densely spaced features 34 are placed in pattern B. These patterns are then utilized to generate first and second masks which are utilized in an actual imaging process. FIG. 8 illustrates the overall flow of the foregoing example.

In an optional step (Step 25), it is noted that the patterns generated as a result of Step 19 can be subjected to a verification process that simulates the imaging performance of the two patterns so as to confirm the image resulting from the combined exposures of both patterns produces the desired target pattern within an acceptable error tolerance. This verification process can also be performed via any suitable simulation process.

Figure 9:
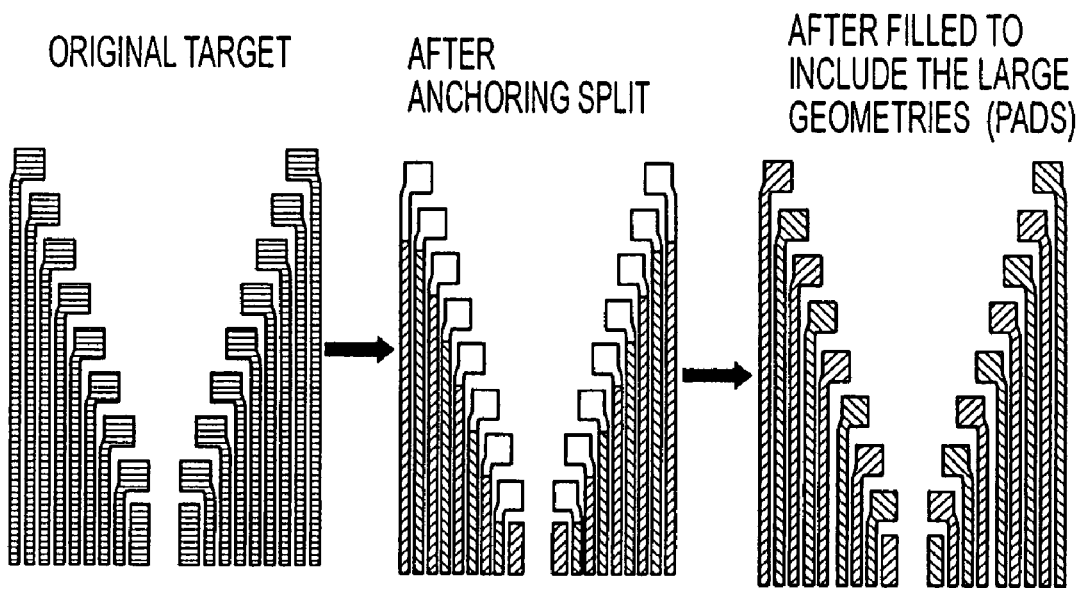
FIGS. 9-11 illustrate additional examples of the decomposition process being applied to other target patterns.
Figure 10:
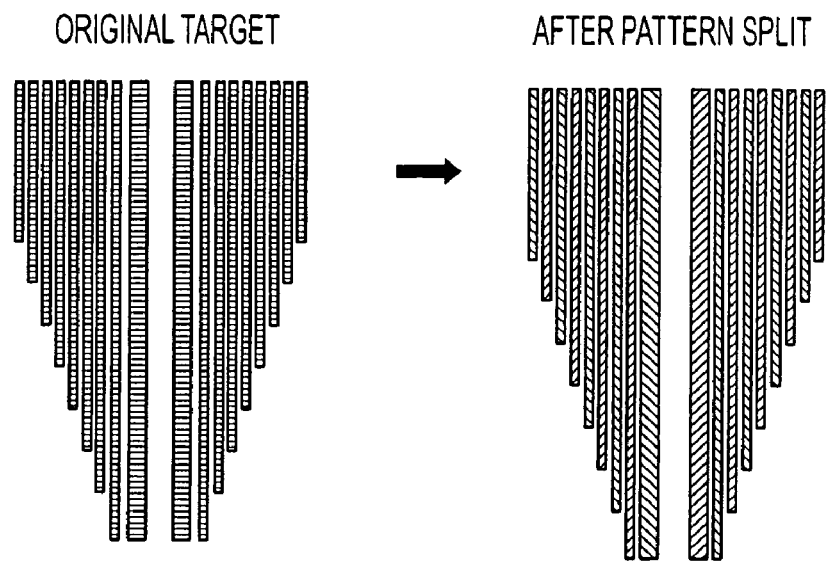
Figure 11:
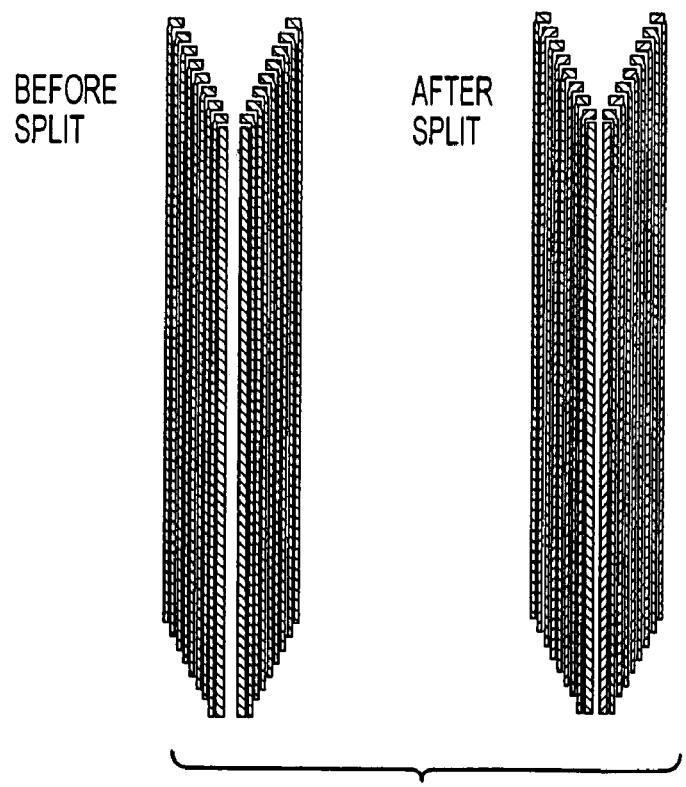

FIG. 9 illustrates an example of the decomposition process being applied to a flash memory structure. Referring to FIG. 9, the densely spaced features of the original pattern are decomposed or assigned to separate masks utilizing the foregoing process comprising the use of the anchoring feature. It is noted that the pattern includes non-densely spaced pads at the ends of each of the line features. Once the features are decomposed, the pads are placed back into the patterns. In the example shown, the pads are respectively colored so as to continue the coloring of the given line feature the given pad is connected to. FIGS. 10 and 11 show additional examples of target patterns being split utilizing the process of the present invention.

As detailed above, the process of the present invention provides numerous advantages over the known decomposition processes. Most importantly, the process provides for a quick and efficient method of decomposing the target pattern, and eliminates the need for the generation of a complicated set of rules to govern pattern decomposition. In particular, the process of the present invention allows for an efficient method of decomposing any localized densely spaced pattern group. Furthermore, the process can readily decompose complex two dimensional feature shapes without the need for generating special rules.

Variations of the exemplary process detailed above are also possible. For example, any suitable data format can be utilized for processing the pattern data. It is also noted that the patterns are typically represented utilizing an X-Y coordinate system, as this allows for ready identification of the location of the features within the pattern. This format also readily provides for the growing of the anchoring feature.

In another variation, it is possible to apply optical proximity correction treatments to the decomposed patterns resulting from the process of the present invention. Further, either rule-based or model-based OPC treatments may be utilized on the decomposed patterns.

In yet another variation, different shapes other than the rectangle shape disclosed above may be utilized when growing the anchoring feature. Also, the anchoring feature may also take different shapes. In the given embodiment, the shape of the "grown area" is selected such that the area encompasses the feature adjacent the anchoring feature and complies with the size rules defined above concerning CD and pitch. Further, the process can be utilized to decompose local dense patterns having different sizes and shapes (e.g., non-uniform line end length) within the local pattern (i.e., the adjacent features being decomposed can have different sizes and shapes).

In another variation, the amount the anchoring feature is grown is equal to a value which is larger than the minimal acceptable pitch. It is noted that a simulation process may be utilized to determine the minimum CD and pitch for the given process, and then these values can be utilized in the process of the present invention.

Figure 12:
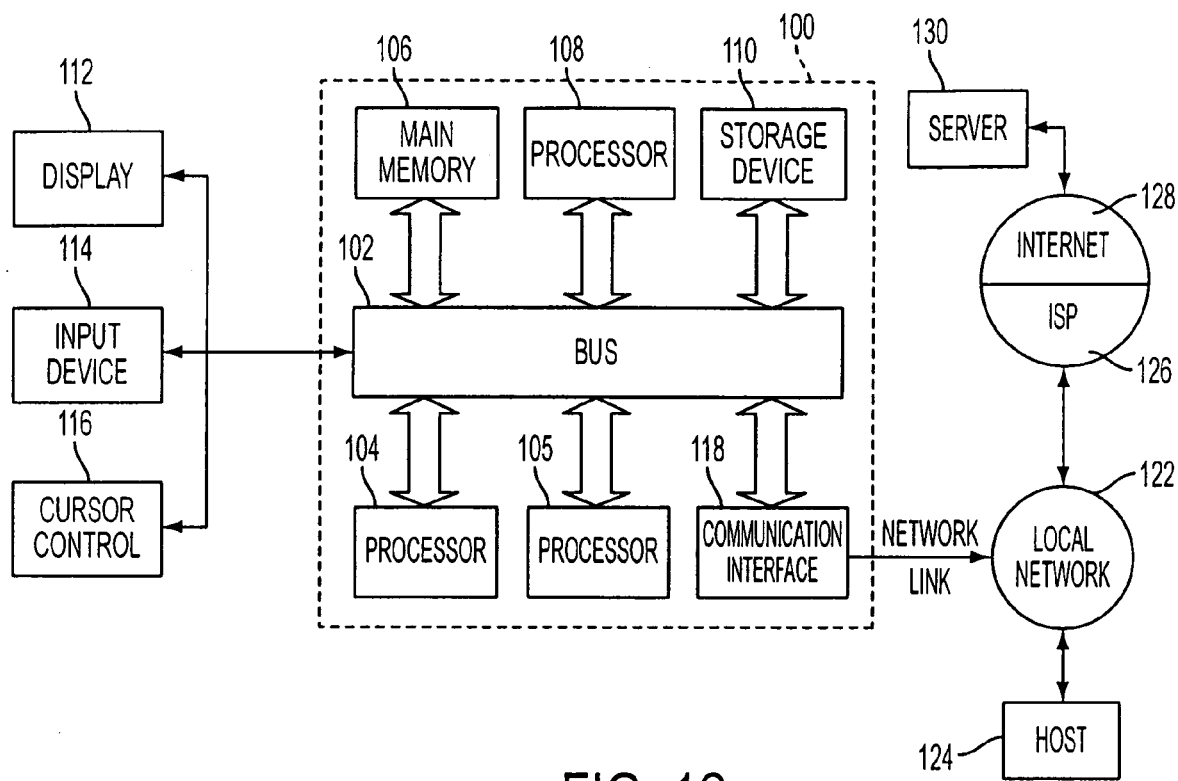
FIG. 12 is a block diagram that illustrates a computer system which can implement illumination optimization according to an embodiment of the present invention.

FIG. 12 is a block diagram that illustrates a computer system 100 which can implement the pattern decomposition process detailed above. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, the coloring process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 13:
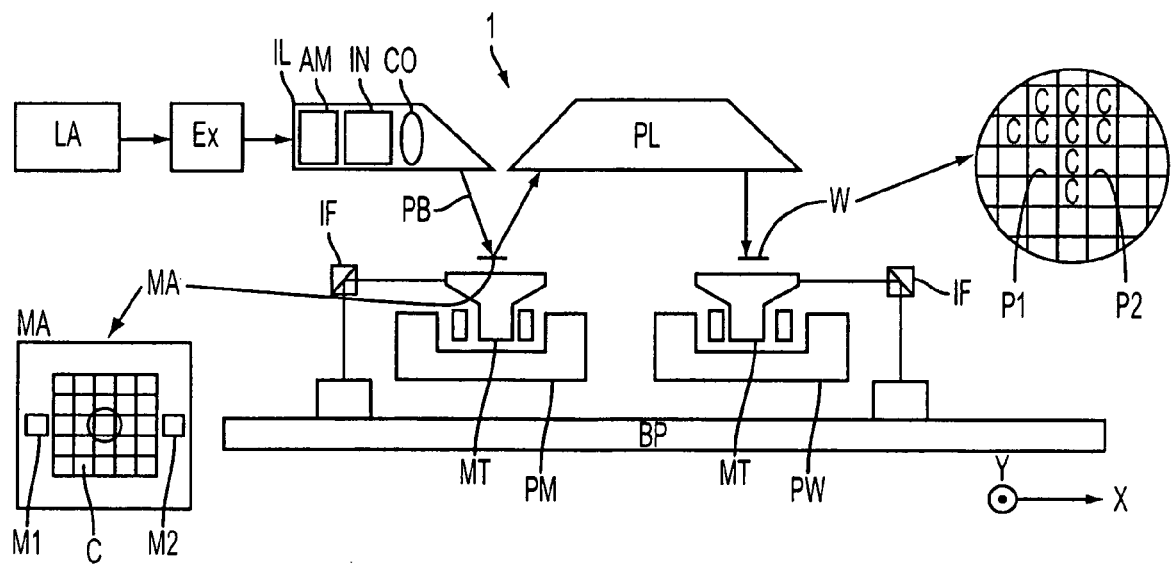
FIG. 13 schematically depicts an exemplary lithographic projection apparatus suitable for use with a mask designed with the aid of the disclosed concepts.

FIG. 13 schematically depicts a lithographic projection apparatus suitable for use with a mask designed with the aid of the current invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g., a reticle), and connected to first positioning means for accurately positioning the mask with respect to item PL;

a second object table (substrate table) WT provided with a substrate holder for holding a substrate W (e.g., a resist-coated silicon wafer), and connected to second positioning means for accurately positioning the substrate with respect to item PL;

a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 13 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 13. However, in the case of a wafer stepper (as opposed to a step-and-scan tool) the mask table MT may just be connected to a short-stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Additionally, software may implement or aid in performing the disclosed concepts. Software functionalities of a computer system involve programming, including executable code, may be used to implement the above described imaging model. The software code is executable by the general-purpose computer. In operation, the code, and possibly the associated data records, are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platforms discussed above. Volatile media include dynamic memory, such as main memory of such a computer platform. Physical transmission media include coaxial cables, copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A computer-implemented method for decomposing a target pattern containing features to be printed on a wafer, into multiple patterns, the computer-implemented method comprising the steps of:

(a) determining a minimum critical dimension and pitch associated with a process to be utilized to image said multiple patterns;

(b) generating an anchoring feature;

(c) disposing said anchoring feature adjacent a first feature of said target pattern;

(d) growing said anchoring feature a predetermined amount so as to define a first area;

(e) assigning any feature within said first area to a first pattern;

(f) disposing said anchoring feature adjacent a second feature of said target pattern;

(g) growing said anchoring feature said predetermined amount so as to define a second area; and (h) assigning any feature within said second area to a second pattern, wherein steps (a)-(h) are implemented using the computer.

2. A method for decomposing a target pattern according to claim 1, wherein steps (c)-(h) are repeatedly performed so as to process all densely spaced features contained in said target pattern.

3. A method for decomposing a target pattern according to claim 1, wherein a width of said anchoring feature is equal to or less than half of said minimum critical dimension.

4. A method for decomposing a target pattern according to claim 3, wherein said predetermined amount is equal to said pitch.

5. A method for decomposing a target pattern according to claim 1, wherein all non-densely spaced features contained in said target pattern are disposed in either of said first pattern or said second pattern.

6. A method for decomposing a target pattern according to claim 1, further comprising the step of applying optical proximity correction to said first pattern and said second pattern.

7. A computer readable storage medium storing a computer program for decomposing a target pattern containing features to be printed on a wafer, into multiple patterns, when executed, causing a computer to perform the steps of:

(a) determining a minimum critical dimension and pitch associated with a process to be utilized to image said multiple patterns;

(b) gen crating an anchoring feature;

(c) disposing said anchoring feature adjacent a first feature of said target pattern;

(d) growing said anchoring feature a predetermined amount so as to define a first area;

(e) assigning any feature within said first area to a first pattern;

(f) disposing said anchoring feature adjacent a second feature of said target pattern;

(g) growing said anchoring feature said predetermined amount so as to define a second area; and (h) assigning any feature within said second area to a second pattern.

8. A computer readable storage medium according to claim 7, wherein steps (c)-(h) are repeatedly performed so as to process all densely spaced features contained in said target pattern.

9. A computer readable storage medium according to claim 7, wherein a width of said anchoring feature is equal to or less than half of said minimum critical dimension.

10. A computer readable storage medium according to claim 9, wherein said predetermined amount is equal to said pitch.

11. A computer readable storage medium according to claim 7, wherein all non-densely spaced features contained in said target pattern are disposed in either of said first pattern or said second pattern.

12. A computer readable storage medium according to claim 7, further comprising the step of applying optical proximity correction to said first pattern and said second pattern.

13. A device manufacturing method comprising the steps of:

(a) providing a substrate that is at least partially covered by a layer of radiation-sensitive material;

(b) providing a projection beam of radiation using an imaging system;

(c) using patterns on masks to endow the projection beam with patterns in its cross-section;

(d) projecting the patterned beam of radiation onto a target portion of the layer of radiation-sensitive material, wherein in step (c), providing a pattern on a mask includes the steps of:

(a1) determining a minimum critical dimension and pitch associated with a process to be utilized to image said multiple patterns;

(b1) generating an anchoring feature;

(c1) disposing said anchoring feature adjacent a first feature of said target pattern;

(d1) growing said anchoring feature a predetermined amount so as to define a first area;

(e1) assigning any feature within said first area to a first pattern;

(f1) disposing said anchoring feature adjacent a second feature of said target pattern;

(g1) growing said anchoring feature said predetermined amount so as to define a second area; and (h1) assigning any feature within said second area to a second pattern.

14. A device manufacturing method according to claim 13, wherein steps (c)-(h) are repeatedly performed so as to process all densely spaced features contained in said target pattern.

15. A device manufacturing method according to claim 13, wherein a width of said anchoring feature is equal to or less than half of said minimum critical dimension.

16. A device manufacturing method according to claim 15, wherein said predetermined amount is equal to said pitch.

17. A method for generating masks to he utilized in a photolithography process, said method comprising the steps of:

(a) determining a minimum critical dimension and pitch associated with said process to be utilized to image said masks;

(b) generating an anchoring feature;

(c) disposing said anchoring feature adjacent a first feature of a target pattern;

(d) growing said anchoring feature a predetermined amount so as to define a first area;

(e) assigning any feature within said first area to a first pattern;

(f) disposing said anchoring feature adjacent a second feature of said target pattern;

(g) growing said anchoring feature said predetermined amount so as to define a second area;

(h) assigning any feature within said second area to a second pattern; and (i) generating a first mask corresponding to said first pattern, and a second mask corresponding to said second pattern wherein step (a)-(i) are implemented using the computer.

18. A method for generating masks according to claim 17, wherein steps (c)-(h) are repeatedly performed so as to process all densely spaced features contained in said target pattern.

19. A method for generating masks according to claim 17, wherein a width of said anchoring feature is equal to or less than half of said minimum critical dimension.

20. A method for generating masks according to claim 19, wherein said predetermined amount is equal to said pitch.

* * * * *